United States Patent [19]

Clemens

[11] Patent Number: 5,019,942
[45] Date of Patent: May 28, 1991

[54] INSULATING APPARATUS FOR ELECTRONIC DEVICE ASSEMBLIES

[75] Inventor: Donald L. Clemens, The Colony, Tex.

[73] Assignee: Thermalloy Incorporated, Dallas, Tex.

[21] Appl. No.: 162,283

[22] Filed: Feb. 29, 1988

Related U.S. Application Data

[63] Continuation of Ser. No. 126,823, Nov. 30, 1987, abandoned, which is a continuation of Ser. No. 887,191, Jul. 21, 1986, abandoned.

[51] Int. Cl.⁵ ............................................. H05K 7/20
[52] U.S. Cl. ................................. 361/388; 165/80.3; 357/81
[58] Field of Search ................ 174/16 HS, 52 FP, 66, 174/67, 16.3, 52.4; 357/79, 81; 361/383, 386, 387, 388, 400; 165/80.2, 80.3

[56] References Cited

U.S. PATENT DOCUMENTS

| 3,548,927 | 12/1970 | Spurling | 174/16 HS |
| 3,558,994 | 1/1971 | Bernstein | 165/80.3 |
| 3,801,874 | 4/1974 | Stefani | 174/16 HS |
| 4,054,901 | 10/1977 | Edwards | 174/16 HS |
| 4,215,361 | 7/1980 | McCarthy | 357/81 |
| 4,236,777 | 12/1980 | Merlina | 174/52 FP |
| 4,259,685 | 3/1981 | Romano | 357/79 |
| 4,359,619 | 11/1982 | Bergoltz | 174/66 |
| 4,505,403 | 3/1985 | Bowden, Jr. | 174/67 |
| 4,552,206 | 11/1985 | Johnson | 165/80.3 |
| 4,605,817 | 8/1986 | Lopez | 174/67 |
| 4,605,986 | 8/1986 | Bentz | 361/386 |
| 4,648,008 | 3/1987 | Neyroud | 361/388 |

FOREIGN PATENT DOCUMENTS 2425723 12/1975 Fed. Rep. of Germany .

Primary Examiner—Gerald P. Tolin
Attorney, Agent, or Firm—Richards, Medlock & Andrews

[57] ABSTRACT

Disclosed are insulating covers for electronic device packages secured to heat sinks by clips. The covers provide minimum predetermined creepage distance between the electronic device packages and the heat sinks upon which they are mounted.

7 Claims, 2 Drawing Sheets

INSULATING APPARATUS FOR ELECTRONIC DEVICE ASSEMBLIES

This is a continuation of application Ser. No. 07/126,823 filed Nov. 30, 1987, now abandoned which is a continuation of application Ser. No. 06/887,191 filed July 21, 1986, now abandoned entitled Insulating Apparatus for Electronic Device Assemblies.

This invention relates generally to electronic components. More particularly, it relates to devices for electrically insulating electronic device packages from the heat sinks on which they are mounted.

Various arrangements are used to secure electronic device packages to heat sinks to ensure effective heat transfer from the electronic device package to the heat sink. For instance, for in-line type electronic device packages in which the leads of the device extend from one edge of the device package in a parallel row, it is known to secure the package to the heat sink by a screw or rivet extending through a hole in a flange on the package and through an aligned hole on the heat sink. If a screw is used, it may be secured by a nut or the like on the opposite side of the heat sink from the electronic device package. The electronic device package is precisely aligned by the screw or rivet with respect to the heat sink. This feature is significant in that it enables the electronic device package to be pre-assembled with the heat sink and the entire assembly robotically mounted on a printed circuit board or the like. However, this approach is labor intensive and therefore costly and requires precise manual alignment of the electronic device package with respect to the heat sink.

Heat sinks have been developed wherein the screw or rivet is replaced with a resilient clip positioned to grip an electronic device package inserted between the clip and the heat sink. This approach has the advantage of substantially reducing assembly time compared to the screw or rivet arrangement and therefore is preferred. However, if the electronic device package is not securely aligned with respect to the heat sink by the clip, vibration or other mechanical forces may shift the electronic device package with respect to the heat sink and prevent automatic handling of the heat sink and electronic device package.

Another significant problem associated with in-line electronic device packages is that of maintaining a predetermined minimum creep distance between the electronic device package and the heat sink. Creep, for purposes of this application, is the conduction of electricity across the surface of an insulator. More specifically, the creep distance is the shortest distance along the surface of an insulator between two electrically conductive surfaces separated by the insulator. Lengthening the creep distance reduces the possibility of arc damage or tracking. In the case of two adjacent conductive surfaces, a creep surface may be interposed between the conductive surfaces to lengthen the creep distance. A creep surface, for purposes of this application, is an insulating surface which provides physical separation between two electrical conductors of different potential. In that case, the creep distance is not defined by the physical distance separating the conductive surfaces, but rather is the shortest linear path along the exterior of the creep surface. Maintaining a minimum predetermined creep distance is important not only to prevent damage to electronic components during use, but may be required to conform to established safety standards. For instance, the European safety code for electronics (VDE) requires a minimum creep distance of three millimeters between conductive surfaces.

The problem of creep exists with in-line electronic device packages between the conductive body of the heat sink and the body and leads of the electronic device package. If the voltage differential between the package and the heat sink is great enough (or the creep distance between them small enough) arcing may occur with the possibility of damage or destruction of the semiconductor device contained in the package or to other devices located nearby. It is known to interpose a thin layer of an electrically insulating material between the base of an electronic device package and the heat sink, particularly with packages secured to the heat sink with screws or rivets extending through a hole in a flange forming a part of the electronic device package. Additionally, an insulating washer or spacer may be interposed about the screw or rivet between the flange of the electronic device package and the heat sink. However, these approaches are inadequate with heat sinks utilizing clips since the leads remain exposed to the conductive clip and the body is in direct contact therewith.

None of the previously existing configurations satisfactorily solve all the problems associated with maintaining alignment of an electronic device package mounted on a heat sink by a clip while providing a minimum predetermined creep distance between the electronic device package and the heat sink.

This invention provides an insulating cover for placement about an electronic device package mounted on a heat sink having a clip securing the package. The cover provides a minimum predetermined creep distance for the electronic device package. The cover includes a cavity for receiving the electronic device package and means for aligning the package with respect to the cover and to the heat sink. Thus the invention provides an improved insulating cover for an electronic device package mounted on a heat sink having a clip which aligns the electronic device package with respect to the heat sink and insures a maximum predetermined creep distance between the electronic device package and the heat sink.

So that the manner in which the above recited features and advantages of the invention as well as others which will become apparent to those skilled in the art are obtained and can be understood in detail, a more thorough understanding of the invention briefly summarized above may be had by reference to the description of various embodiments thereof which are illustrated in the accompanying drawing, which drawing forms a part of the specification and in which like numerals depict like parts in the several views and in which.

It is to be noted that the appended drawing illustrates only a preferred embodiment of the invention and is therefore not to be considered limiting of its scope, for the invention may admit to other equally effective embodiments.

Figure 1:
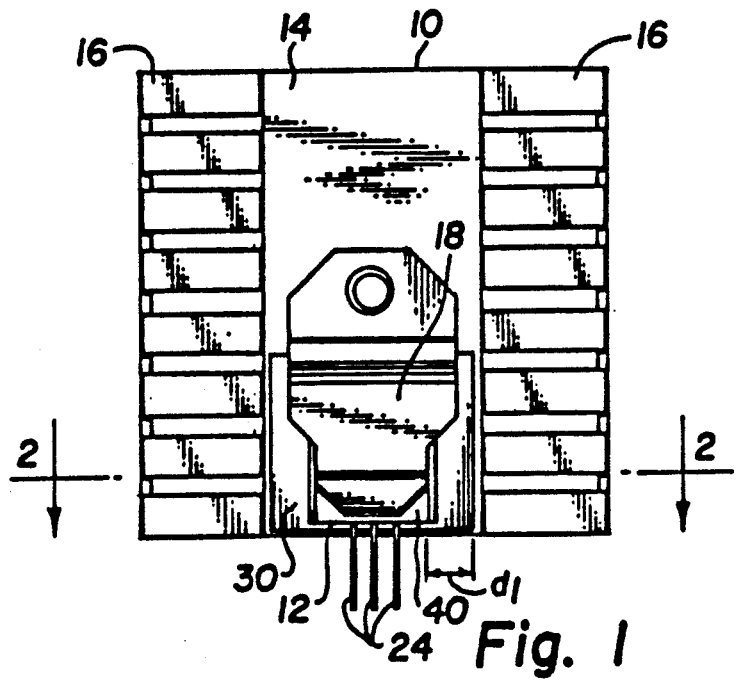
FIG. 1 is a front view of an assembly of a heat sink, electronic device package and insulating cover according to the invention.
Figure 2:
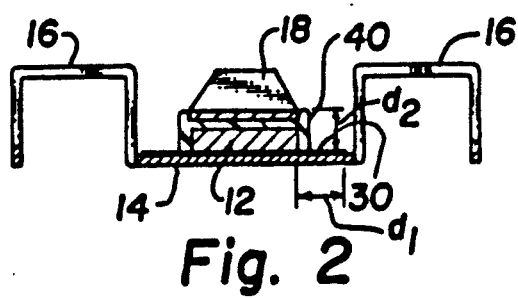
FIG. 2 is a cross-sectional view taken along line 2—2 of FIG. 1.
Figure 3:
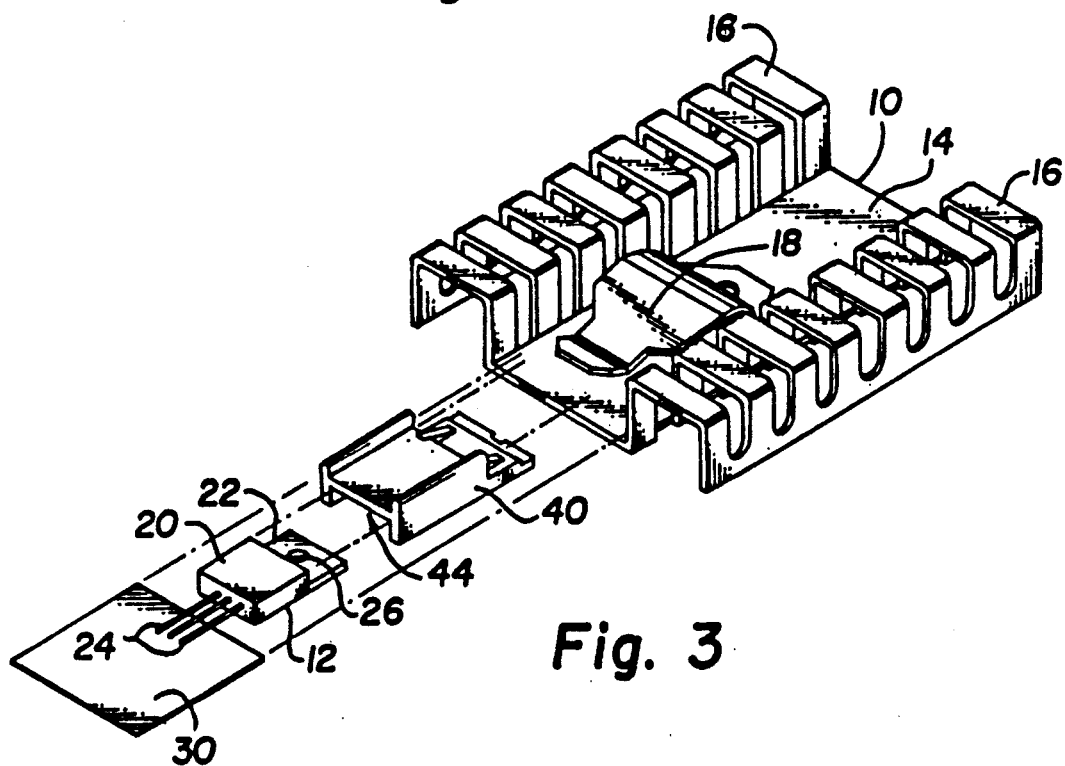
FIG. 3 is an exploded perspective view of the assembly of FIG. 1.
Figure 4:
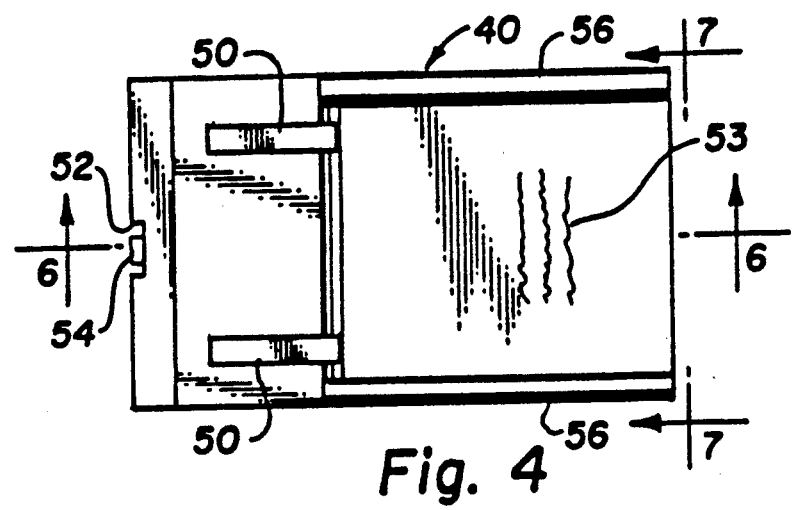
FIG 4 is a top view of the insulating cover of FIG. 1.
Figure 5:
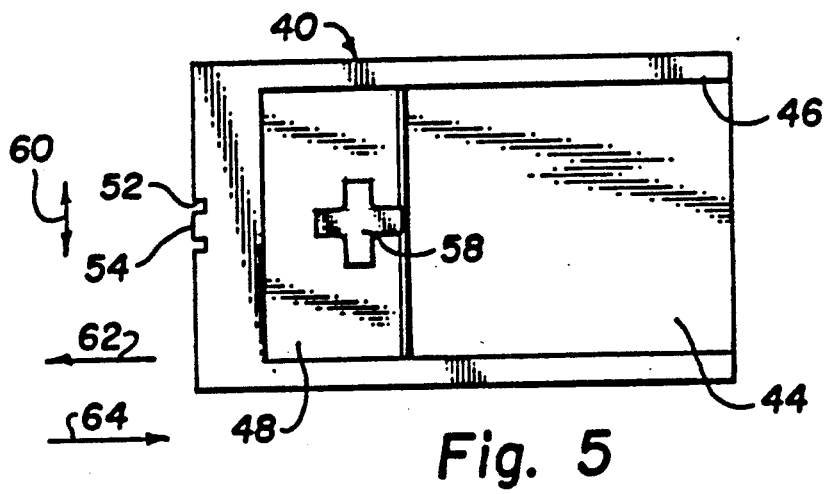
FIG. 5 is a bottom view of the insulating cover of FIG. 1.
Figure 6:
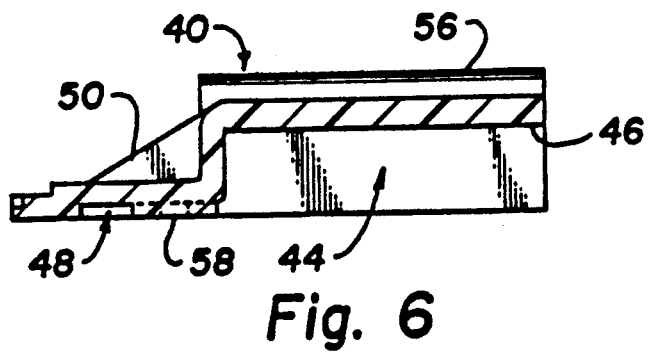
FIG. 6 is a cross-sectional view of the insulating cover of FIG. 4 taken along line 6—6 of FIG. 4.
Figure 7:
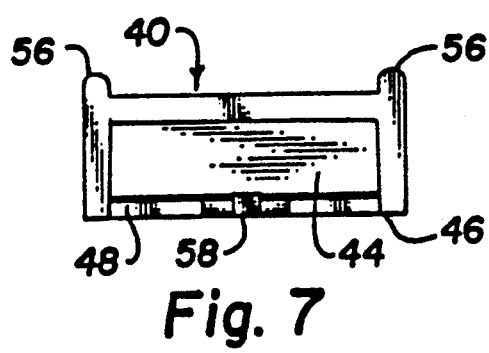
FIG. 7 is an end view of the insulating cover of FIG. 4 taken along line 7—7.

Referring now to FIGS. 1-3, there is shown a heat sink 10 for rapid dissipation of heat generated by electronic device package 12. For purposes of this invention, a heat sink is any body of metal or like material used in connection with an electronic device package for transferring heat from the semiconductor device contained in the electronic device package and rapidly dissipating the heat to the environment by convection, conduction and/or radiation. The heat sink illustrated includes base portion 14 and a pair of laterally extending fins 16. Of course, it is to be recognized that any configuration of heat sink may be selected as is found effective in rapidly conducting heat away from the electronic device package and radiating and/or convecting the heat to the environment. The heat sink illustrated: further includes bonded clip 18 (such as is disclosed in co-pending patent application Ser. No. 836,816 entitled Bonded Clip Heat Sink) mounted on one end of the base of the heat sink and extending to a free end cantilevered over the base. Of course, the clip may be mounted on the body of the heat sink by other conventional methods or may form an integral part thereof as known in the art without affecting the scope of this invention.

Electronic device package 12 includes housing 20, flange 22 and a row of parallel leads 24 extending from one end edge thereof. The electronic device package illustrated is an in-line type package such as a TO-218 or TO-220 package. The flange 22 includes an aperture 26 used in other applications to secure the electronic device package to a heat sink with a screw or rivet as discussed above. A layer 30 of an electrically insulating material is located between the electronic device package and the base of the heat sink. The insulating layer provides a minimum predefined creep distance ($d_1$ in FIGS. 1 and 2) on all edges of the electronic device package between the electronic device package and the base of the heat sink. The insulating layer is preferably constructed of relatively thin flexible material which is easily manufactured for the relative dimensions of the heat sink and electronic device package.

Cover 40 is located between the electronic device package and the clip 18 and is shown in greater detail in FIGS. 4-7. The cover is likewise constructed of electrically insulating material such as nylon which is relatively strong and easily molded. The cover includes a monolithic molded body defining a cavity 44. The cavity is constructed for receipt of the housing of the electronic device package with the leads 24 of the electronic device package projecting through opening 46 communicating with the cavity. The cavity further includes a portion 48 for receipt of the flange 22 of the electronic device package. The upper side of the cover includes a pair of laterally spaced reinforcing ribs 50. Notch 52 is formed in one end edge of the cover, thereby ensuring that mold gate 54 is recessed from the end edge of the cover. Indicia 53 may be applied or integrally molded with the body of the cover. The indicia may contain any suitable useful information such as the identity of the electronic device package enclosed by the cover.

The height and length of the cover and its thickness with respect to the dimensions of the electronic device package, in conjunction with the insulating layer 30, provide a predetermined creep distance (equal to at least distance $d_2$ in FIG. 2) between the body and leads of the electronic device package and the heat sink and, in particular, the clip of the heat sink.

Means are also provided to accurately align and position the electronic device package with respect to the cover and to the heat sink. In the illustrated embodiment the aligning means includes a pair of laterally spaced ribs 56 extending along the upper side of the cover. The ribs are designed to closely contact the side edges of the clip 18 of the heat sink (as shown in FIG. 2) to accurately locate and align the cover with respect to the heat sink. Therefore, it will be appreciated that the relative location and lateral spacing of the ribs may be varied to accommodate different heat sink and clip configurations. The aligning means may also include a stud 58 or the like projecting into the portion 48 of the cavity 44 occupied by the flange of the electronic device package. The stud is generally X-shaped in cross-section, although it is recognized that a circular or other suitable configuration may be employed if desired. Specifically, the stud is inserted in close confinement into aperture 26 of the electronic device package when located in cavity 44. Alternatively, the stud may engage a notch or indentation or on an edge elsewhere on the flange or body of the electronic device package. The cavity 44 of the cover is also constructed for close confinement of the electronic device package in lateral direction 60 and in longitudinal direction 64 (shown in FIG. 5). The stud acts to restrain the electronic device package against longitudinal movement in an opposite longitudinal direction 64. Since the cover is accurately aligned by ribs 56 with respect to the heat sink; and since the electronic device package is aligned with respect to the cover by cavity 44 and stud 58, the electronic device package is thus simultaneously aligned with the heat sink when received by the cover. Multiple spaced studs and a like number of apertures in the electronic device package may be used to align the electronic device package with the cover. In such cases it would not be necessary to construct the cavity of the cover for receipt of the electronic device package in close confinement.

Although the invention has been described above with regard to particular and preferred embodiments, these are advanced for illustrative purposes only and are not intended to limit the scope of this invention. For instance, the cover may have an integral wall extending between the electronic device package and the base of the heat sink enclosing the cavity 44 (including portion 48) except for opening 46, thus obviating the need for a separate insulating layer 30. Similarly, although the cover is illustrated as a monolithic molded piece, other arrangements for constructing the cover may be employed. Of course, it is within the scope of the invention to utilize the cover described solely to align and electronic device package with a heat sink without regard to maintaining a predetermined creep distance. All such variations remain within the spirit and scope of the invention as defined by the appended claims.

What is claimed:

1. A unitary insulating cover for providing a predetermined creep distance between an electronic device package and a heat sink having a base portion and a spring clip for retaining said electronic device package between said spring clip and said base portion and in thermal contact with said base portion comprising:
  (a) an elongated monolithic body of electrically insulating material adapted to be interposed between an electronic device package and a spring clip for retaining the electronic device package between the spring clip and the base of a heat sink, said monolithic body having a length at least as long as the length of the electronic device package to be retained between the spring clip and the heat sink base portion; and
  (b) substantially parallel walls depending from the full length of opposite edges of said body cooperating with said body to define a cavity adapted to receive and substantially enclose the full length of the electronic device package.

2. An insulating cover as defined in claim 1 including means for positioning the electronic device package in predetermined alignment with the heat sink.

3. An insulating cover as defined in claim 2 wherein said means for positioning comprises:
  (a) stud means projecting from said monolithic body adapted to mate with an aperture in the electronic device package; and
  (b) alignment means projecting from said monolithic body adapted to engage the spring clip in predetermined arrangement to align the body of said cover with the base of the heat sink.

4. The combination comprising:
  (a) an electronic device package having leads projecting from one edge thereof;
  (b) a heat sink having a base and a spring clip urging said electronic device package into contact with said heat sink base and securing said device package therebetween; and
  (c) an insulating cover comprising:
    (i) an elongated monolithic body of electrically insulating material having a length at least as long as said electronic device package interposed between said electronic device package and said spring clip; and
    (ii) substantially parallel side walls depending from the full length of opposite edges of said body cooperating with said body to define a cavity receiving and substantially enclosing the full length of said electronic device package.

5. The combination set forth in claim 4 including an electrically insulating material disposed between said heat sink base and said electronic device package.

6. The combination set forth in claim 4 wherein said cover includes means positioning said electronic device package in predetermined alignment with said heat sink.

7. The combination set forth in claim 6 wherein said means positioning said electronic device package comprises:
  (a) stud means projecting from said monolithic body in register with an aperture in said electronic device package; and
  (b) alignment means projecting from said monolithic body engaging said spring clip in predetermined arrangement to align the body of said cover with said heat sink.

* * * * *